(12) United States Patent
Butler (10) Patent No.: US 10,234,774 B2
(45) Date of Patent: Mar. 19, 2019

(54) LITHOGRAPHIC APPARATUS

(71) Applicant: ASML Netherlands B.V., Veldhoven (NL)

(72) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/949,057

(22) Filed: Apr. 9, 2018

(65) Prior Publication Data

US 2018/0224755 A1     Aug. 9, 2018

Related U.S. Application Data

(63) Continuation of application No. 14/396,027, filed as application No. PCT/EP2013/057155 on Apr. 5, 2013, now Pat. No. 9,946,168.

(Continued)

(51) Int. Cl.
*G03B 27/62* (2006.01)
*G03B 27/42* (2006.01)
(Continued)

(52) U.S. Cl.
CPC ........ *G03F 7/70725* (2013.01); *G03F 7/7085* (2013.01); *G03F 7/70191* (2013.01);
(Continued)

(58) Field of Classification Search
CPC ............ G03F 7/70191; G03F 7/70516; G03F 7/70716; G03F 7/70725; G03F 7/70783;
(Continued)

(56) References Cited

U.S. PATENT DOCUMENTS 5,699,145 A   12/1997  Makinouchi et al.
5,900,707 A    5/1999  Wakui
(Continued)

FOREIGN PATENT DOCUMENTS

CN    101510052    8/2009
EP    1 248 288    10/2002
(Continued)

OTHER PUBLICATIONS

International Search Report dated Oct. 9, 2013 in corresponding International Patent Application No. PCT/EP2013/057155.
(Continued)

*Primary Examiner* — Christina A Riddle
(74) *Attorney, Agent, or Firm* — Pillsbury Winthrop Shaw Pittman LLP (57) ABSTRACT

A lithographic apparatus includes a patterning device support to support a patterning device, the patterning device system including a moveable structure movably arranged relative to an object, a patterning device holder movably arranged relative to the movable structure to hold the patterning device, an actuator to move the movable structure relative to the object, and an ultra short stroke actuator to move the patterning device holder with respect to the movable structure; a substrate support to hold a substrate; a projection system to project a patterned radiation beam onto a target portion of the substrate; a transmission image sensor for measuring a position of the patterned radiation beam downstream of the projection system; and a calibrator for determining a relationship between magnitude of an applied control signal to the ultra short stroke actuator and resulting change in position of the patterned radiation beam and/or patterning device holder and/or patterning device.

3 Claims, 7 Drawing Sheets

Related U.S. Application Data (60) Provisional application No. 61/639,545, filed on Apr. 27, 2012.

(51) Int. Cl.
    *G03F 7/20*          (2006.01)
    *G03F 9/00*          (2006.01)

(52) U.S. Cl.
    CPC ...... *G03F 7/70516* (2013.01); *G03F 7/70758* (2013.01); *G03F 7/70775* (2013.01); *G03F 7/70783* (2013.01); *G03F 7/70825* (2013.01); *G03F 9/7019* (2013.01)

(58) Field of Classification Search
    CPC ............. G03F 7/70733; G03F 7/70758; G03F 7/70775; G03F 7/70825; G03F 7/70525; G03F 7/70533; G03F 7/7085; G03F 7/709; G03F 7/70483; G03F 7/70491; G03F 7/70558; G03F 7/70625; G03F 7/70591; G03F 7/70941; G03F 7/70666; G03F 9/7007; G03F 9/7011; G03F 9/7015; G03F 9/7019
    USPC ...... 355/52, 53, 55, 67–71, 72–77; 430/5, 8, 430/22, 30, 311, 312; 250/492.1, 492.2, 250/492.22, 493.1, 548
    See application file for complete search history.

(56) References Cited

U.S. PATENT DOCUMENTS

| | | | |
|---|---|---|---|
| 6,798,497 | B2 | 9/2004 | Butler |
| 7,256,866 | B2 | 8/2007 | Cox et al. |
| 7,333,179 | B2 | 2/2008 | Yuan et al. |
| 7,463,330 | B2 | 12/2008 | Streefkerk et al. |
| 8,553,205 | B2 | 10/2013 | Roux et al. |
| 2002/0026878 | A1* | 3/2002 | Kwan ................ G03F 7/70733 355/72 |
| 2004/0207824 | A1 | 10/2004 | Lof et al. |
| 2004/0257549 | A1 | 12/2004 | Leenders et al. |
| 2005/0134816 | A1* | 6/2005 | Modderman ......... G03F 9/7026 355/53 |
| 2006/0007419 | A1 | 1/2006 | Streefkerk et al. |
| 2006/0033903 | A1 | 2/2006 | Yuan et al. |
| 2006/0077364 | A1 | 4/2006 | Cox et al. |
| 2007/0258079 | A1 | 11/2007 | Kamidi et al. |
| 2008/0319569 | A1* | 12/2008 | Loopstra ............. G03F 7/70775 700/110 |
| 2009/0201477 | A1 | 8/2009 | Butler |
| 2010/0013054 | A1 | 1/2010 | Marth et al. |
| 2011/0149263 | A1 | 6/2011 | Roux et al. |
| 2011/0193510 | A1 | 8/2011 | Fleming |
| 2011/0222039 | A1* | 9/2011 | Valentin ................ G03B 27/52 355/55 |
| 2012/0019794 | A1 | 1/2012 | Hol et al. |
| 2012/0140198 | A1 | 6/2012 | Amin-Shahidi |

FOREIGN PATENT DOCUMENTS

| | | |
|---|---|---|
| JP | 01-172796 | 7/1989 |
| JP | H08-124203 | 5/1996 |
| JP | H10-125594 | 5/1998 |
| JP | 2002076098 | 3/2002 |
| JP | 2003-068640 | 3/2003 |
| JP | 2004343075 | 12/2004 |
| JP | 2006-024939 | 1/2006 |
| JP | 2006-308709 | 11/2006 |
| JP | 2007-201511 | 8/2007 |
| JP | 2009-194384 | 8/2009 |
| JP | 2011192987 | 9/2011 |
| JP | 2012-505447 | 3/2012 |
| WO | 2010/071240 | 6/2010 |

OTHER PUBLICATIONS

Heui Jae Pahk et al., "Ultra precision positioning system for servo motor-piezo actuator using the dual servo loop and digital filter implementation," International Journal of Machine Tools & Manufacture, vol. 41, pp. 51-63 (2001).
Japanese Office Action dated Nov. 16, 2015 in corresponding Japanese Patent Application No. 2015-507449.
Chinese Office Action dated Oct. 19, 2015 in corresponding Chinese Patent Application No. 2013800302575.
Korean Office Action dated Dec. 15, 2015 in corresponding Korean Patent Application No. 10-2014-7032727.
Japanese Office Action dated Nov. 1, 2017 in corresponding Japanese Patent Application No. 2017-021802.
Japanese Office Action issued in corresponding Japanese Patent Application No. 2018-053738, dated Jan. 8, 2019.

\* cited by examiner

LITHOGRAPHIC APPARATUS

CROSS-REFERENCE TO RELATED APPLICATIONS

This application is a continuation of U.S. Ser. No. 14/396,027 filed Oct. 21, 2014, now U.S. Pat. No. 9,946,168, which the U.S. national phase entry of International Patent Application No. PCT/EP2013/057155, filed Apr. 5, 2013, which claims the benefit of priority from U.S. provisional application 61/639,545, which was filed on Apr. 27, 2012, and which is incorporated herein in its entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index. e.g. water, so as to fill a space between the final element of the projection system and the substrate. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In the lithographic apparatus, use is made of a movable support to hold and position an exchangeable object such as the substrate or the patterning device. In a scanning type lithographic apparatus, a movable support is used to support the substrate in order to make the scanning movement. The patterning device may also be supported on a movable support. The movable support is able to position the substrate or patterning device with high accuracy.

To obtain a high accuracy, a known movable support is assembled from a long stroke part, movable with respect to a reference object such as a frame, and a short stroke part, movably arranged with respect to the long stroke part. The short stroke part is configured to support the exchangeable object. The maximum stroke of the long stroke part with respect to reference object is relatively large, while the stroke of the short stroke part with respect to the long stroke part is relatively small.

A long stroke actuator is provided to actuate the long stroke part with respect to the reference object. A short stroke actuator is provided to actuate the short stroke part with respect to the long stroke part. Such long stroke actuator is for instance a linear motor, and may not be very accurate. The main task of the long stroke actuator is to keep the stator part of the short-stroke actuator in the vicinity of the moving part. The short stroke actuator is designed to position the short stroke part with high accuracy.

In order to control the position of the exchangeable object, the position of the second support system for supporting the substrate is determined by a position measurement system, for instance an interferometer system or an encoder system. This measurement is for instance performed in three planar degrees of freedom or in six degrees of freedom. The measured position is compared with a desired position. The position error, i.e. the difference between measured and desired position is fed into a controller which on the basis of this signal provides a control signal which is used to actuate the short stroke actuator.

The long stroke actuator is controlled by using a signal based on the difference between the actual position of the short stroke part and the long stroke part as an input signal for the long stroke actuator controller. The output of this controller makes the long stroke part follow the movements of the short stroke part, therewith keeping the desired position of the short stroke part within the range of the short stroke actuator.

The short stroke actuator may be of the Lorentz type to enable isolation from long-stroke vibrations. Such Lorentz type actuator has a small stiffness. Any other type of actuator having a small stiffness and high accuracy may also be used accurately to control the position of the exchangeable object support by the movable support. The input of a Lorentz actuator is an electrical current, substantially proportional to the desired force.

The force-type-actuator in the stages may limit the achievable feed-forward effect from one stage to the other (e.g. substrate table error fed to patterning device support). In this feed-forward, the position error of one stage needs to be differentiated twice to generate a feed-forward force, which costs one sample delay. This leads to a delayed response of the other stage, limiting positioning accuracy of the stages relative to each other. This feed-forward performance is further limited by calculation delay, amplifier (DAC) delay, and higher-order dynamics of the short-stroke system.

SUMMARY

It is desirable to increase the accuracy of positioning of an exchangeable object such as a patterning device, supported by a movable support.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device support comprising a moveable structure movably arranged with respect to an object, a patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; and a projection system configured to project the patterned radiation beam onto a target portion of the substrate, a position measurement system for measuring a substrate positional error which is a difference between a desired position of the substrate relative to a reference object and an actual position of the substrate relative to the reference object; and a controller configured to move the actuator and the ultra short stroke actuator at least partly on the basis of the substrate positional error.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device support comprising a moveable structure movably arranged with respect to an object, a patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; and a projection system configured to project the patterned radiation beam onto a target portion of the substrate; a position measurement system for measuring a substrate positional error which is a difference between a desired position of the substrate relative to a reference object and an actual position of the substrate relative to the reference object; and a controller configured to move the ultra short stroke actuator exclusively on the basis of: the substrate positional error and optionally a measured position of the patterning device holder relative to the moveable structure.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device system comprising a moveable structure movably arranged with respect to an object, a patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; and a projection system configured to project the patterned radiation beam onto a target portion of the substrate, a position measurement system for measuring a position of the patterning device holder and/or patterning device relative to the moveable structure; and a controller configured to move the ultra short stroke actuator on the basis of a positional error signal and the position of the patterning device holder and/or patterning device measured by the position measurement system.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device system comprising a moveable structure movably arranged with respect to an object, an patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; a projection system configured to project the patterned radiation beam onto a target portion of the substrate; and an open loop controller configured to move the ultra short stroke actuator on the basis of a positional error signal.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device system comprising a moveable structure movably arranged with respect to an object, a patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; a projection system configured to project the patterned radiation beam onto a target portion of the substrate, a transmission image sensor for measuring a position of the patterned radiation beam downstream of the projection system; and a calibrator for determining a relationship between magnitude of an applied control signal to the ultra short stroke actuator and resulting change in position of the patterned radiation beam and/or patterning device holder and/or patterning device.

According to an aspect of the invention, there is provided a lithographic apparatus comprising: a patterning device support constructed to support a patterning device, the patterning device being capable of imparting a radiation beam with a pattern in its cross-section to form a patterned radiation beam; a substrate support constructed to hold a substrate; and a projection system configured to project the patterned radiation beam onto a target portion of the substrate, wherein the patterning device supports comprises: a moveable structure movably arranged with respect to an object, a patterning device holder movably arranged with respect to the movable structure and configured to hold the patterning device; an actuator configured to move the movable structure with respect to the object; and an ultra short stroke actuator configured to move the patterning device holder with respect to the movable structure and comprising a plurality of actuators positioned around at least part of a circumference of the patterning device holder.

According to an aspect of the invention, there is provided a lithographic apparatus comprising: a patterning device support constructed to support a patterning device, the patterning device being capable of imparting a radiation beam with a pattern in its cross-section to form a patterned radiation beam, the patterning device support comprising a moveable structure movably arranged with respect to an object, an patterning device holder movably arranged with respect to the movable structure and configured to hold the patterning device, an actuator configured to move the movable structure with respect to the object, and an ultra short stroke actuator configured to move the patterning device holder with respect to the movable structure; a substrate support constructed to hold a substrate; and a projection system configured to project the patterned radiation beam onto a target portion of the substrate, wherein the ultra short stroke actuator is glued between the patterning device holder and moveable structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
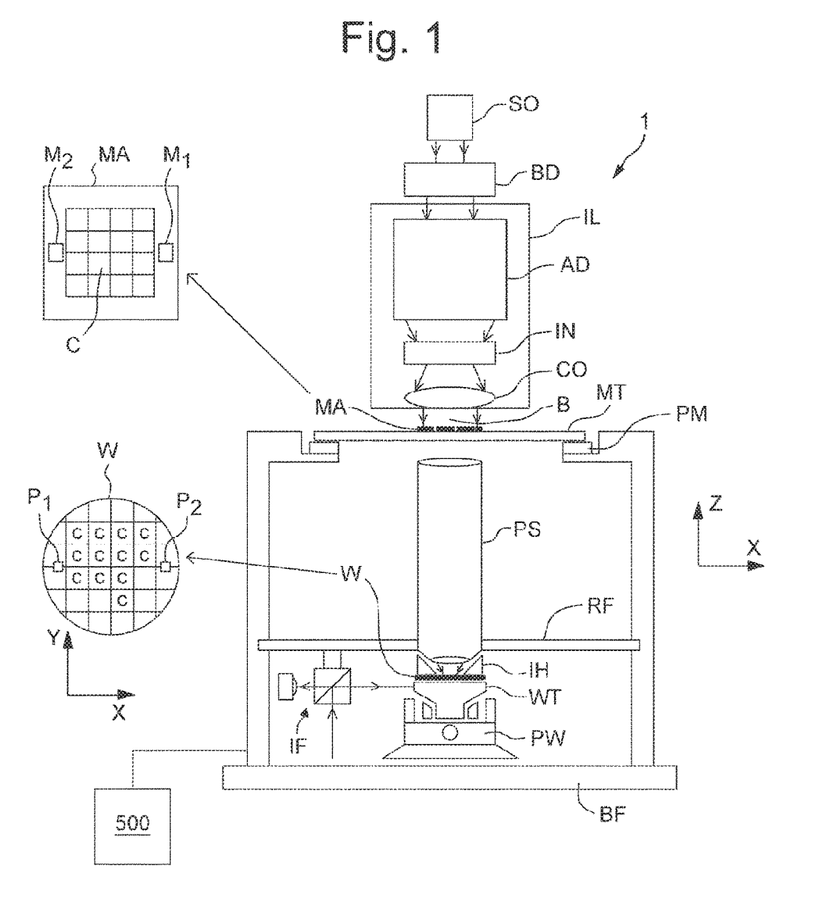
FIG. 1 depicts a lithographic apparatus according to an embodiment of the invention.

FIG. 1 schematically depicts a lithographic apparatus according to one embodiment of the invention. The apparatus comprises:
  an illumination system (illuminator) IL configured to condition a radiation beam B (e.g. UV radiation, DUV radiation or EUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a reflective mask). The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B. e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example an immersion liquid, is provided between the final element of the projection system and the substrate using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

In an embodiment, the liquid is distilled water, although another liquid can be used. An embodiment of the present invention will be described with reference to liquid.

Figure 2:
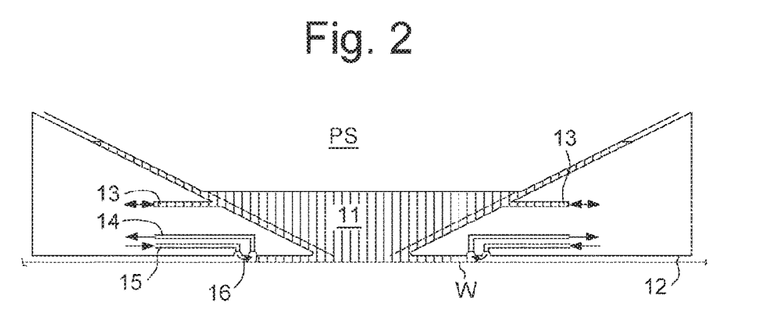
FIG. 2 depicts, in cross-section, a barrier member which may be used in an embodiment of the present invention as an immersion liquid supply system.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 2 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Many other types of liquid supply system are possible. The present invention is neither limited to any particular type of liquid supply system, nor to immersion lithography. The invention may be applied equally in any lithography. In an EUV lithographic apparatus, the beam path is substantially evacuated and immersion arrangements described above are not used.

A control system or controller 500 controls the overall operations of the lithographic apparatus and in particular performs the control schemes described further below. Control system 500 can be embodied as a suitably-programmed general purpose computer comprising a central processing unit, volatile and non-volatile storage devices, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 3:
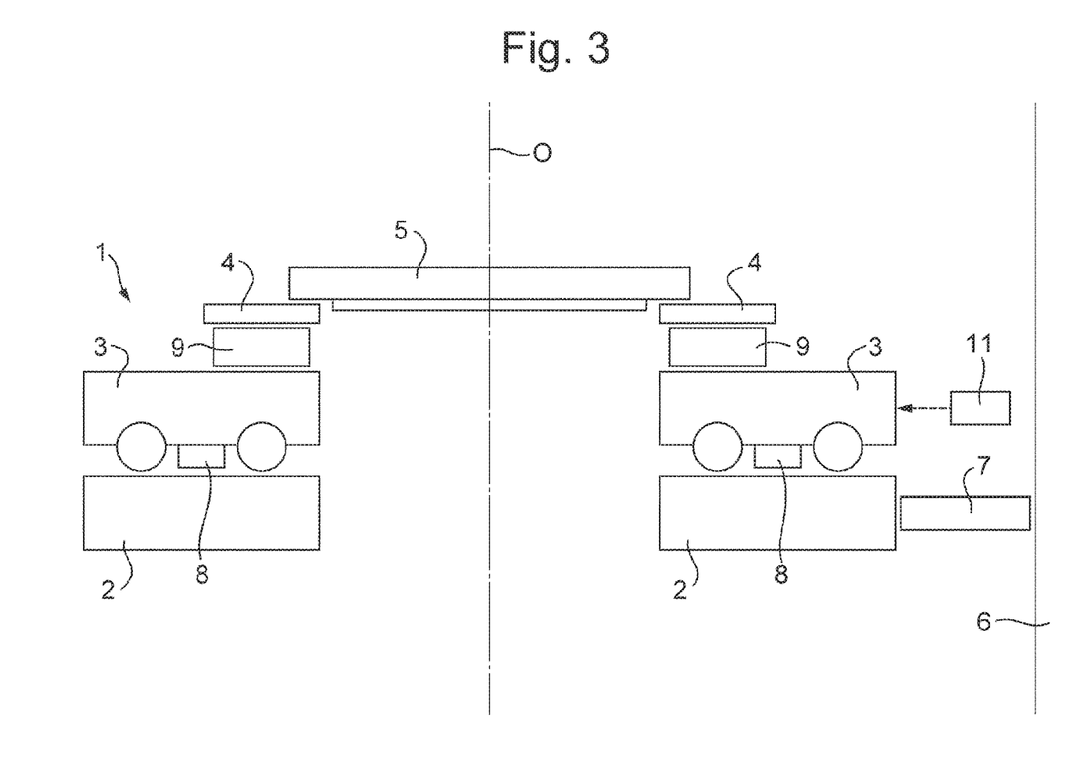
FIG. 3 depicts schematically a cross-sectional view of selected parts of a lithographic apparatus according to an embodiment of the invention.

FIG. 3 shows a side view of a patterning device support according to an embodiment of the invention. The patterning device support generally denoted by reference numeral 1 includes a long stroke part 2. The long stroke part 2 supports a short stroke part 3, and the short stroke part 3 supports a patterning device holding structure or patterning device holder 4. The patterning device holding structure or patterning device holder 4 (e.g. the mask table) supports an exchangeable object, e.g. patterning device 5.

The long stroke part 2 is movably mounted with respect to a reference object 6, for instance a frame (such as e.g. a metrology frame). A long stroke actuator 7 is provided to move the long stroke part 2 with respect to the reference object 6. The long stroke actuator 7 does not exert reaction forces on the reference object 6. A short stroke actuator 8 is provided to move the short stroke part 3 with respect to the long stroke part 2. The short stroke actuator 8 has a relative high accuracy in positioning of the short stroke part 3 with respect to the long stroke part 2, but has a limited working range. The long stroke actuator 7 has a large working range, typically the whole working space of the patterning device support 1 and a relative low accuracy. The main task of the long stroke actuator 8 is to bring the desired position of the patterning device support 1 within the range of the short stroke actuator 8 so that the short stroke actuator 8 may position the patterning device 5 with high accuracy.

A position measurement system 11 has been provided to measure the position of the short stroke part 3 e.g. relative to the reference object 6. In an embodiment, the reference object 6 is the projection lens PS or the metrology frame, MF. The position measurement system 11 may be any system which is capable of measuring the position of the short stroke part 3 with high accuracy, such as an interferometer system or an encoder measurement system.

In order to isolate the short stroke part 3 from vibrations of the long stroke part 2, the short stroke actuator 8 may be of a type having a low stiffness. Such actuator is for instance a Lorentz motor. The input of this type of actuator is an electrical current, proportional to the desired force. The position response to an input force is somewhat delayed because of calculation delay and delay in electronic components. This effect, together with higher-order dynamics, limits the bandwidth of the short-stroke control loop, which in turn limits the achievable stage positioning accuracy. In an alternative embodiment the short stroke actuator 8 may be a reluctance actuator that is provided with flux feedback (as disclosed in US2012/0019794 herein incorporated in its entirety by reference).

It is further remarked that the force-type short stroke actuator 8 also limits the achievable feed-forward effect from substrate table WT to the patterning device support 1. In this feed-forward, the position error of one stage is differentiated twice to create a feed-forward force, which costs one sample delay. This leads to a delayed response of the other stage, limiting positioning accuracy of the stages relative to each other.

Furthermore, due to the low stiffness of the short stroke actuator 8, during acceleration of the stage the full force desired for acceleration of the short stroke part 3 and patterning device holder 4 has to be exerted by the short stroke actuator 8. At the same time the short stroke actuator 8 has to be capable of exerting small forces with high accuracy to make precise positioning of the short stroke part 3. This makes the demand on the short stroke actuator 8, and the driving electronics like the amplifier, even higher.

With increasing demands on imaging accuracy and throughput, it is desirable further to increase the accuracy and decrease the settling time in the positioning of exchangeable objects such as substrates or patterning devices.

According to an embodiment of the present invention, an ultra short stroke actuator 9 has been provided to cause movements between the short stroke part 3 and the patterning device holding structure or patterning device holder 4. Between the short stroke part 3 and the patterning device holding structure or patterning device holder 4 one or more ultra short stroke actuators 9 are arranged. These ultra short stroke actuators 9 have a relative high stiffness and are for instance piezo-elements which create a movement between the short stroke part 3 and the patterning device holding structure or patterning device holder 4. This movement is typically smaller than about ±100 nm.

The ultra short stroke actuator 9 may have a relatively high stiffness as the isolation of long-stroke vibrations is already performed by the short stroke actuator 8 and possibly the long stroke actuator 7. Preferably, the ultra short stroke actuator 9 is a position type actuator, i.e. it directly responds in terms of position. An example of such position type actuator is a piezo-element which gives a deformation as a direct result of an electric voltage or charge.

A similar patterning device support is described in US 2009/0201477 herein incorporated in its entirety by reference. The present invention is directed to different control systems described with reference to FIGS. 5 and 6, a different physical implementation described with reference to FIGS. 3, 8 and 9 and to a calibrator described with reference to FIG. 7.

In an embodiment, the patterning device holder 4 is a table which is supported by an ultra short stroke actuator 9 on the short stroke part 3. In an embodiment the ultra short stroke actuator 9 is adhered on one side to the short stroke part 3 and on the other side to the patterning device holder 4. The ultra short stroke actuator 9 is desirably a piezoelectric stack, desirably a shear piezoelectric stack. In this embodiment it is possible for the ultra short stroke actuator 9 to support the weight of the patterning device holder 4 and patterning device 5. The piezoelectric stack may be a shear piezoelectric stack allowing x y motion (motion in a plane perpendicular to the optical axis O of the apparatus). Each piezoelectric stack shears in both the x and y directions. In an embodiment separate piezoelectric stacks may be provided for movement only in the x direction and for movement only in the y direction.

Figure 4:
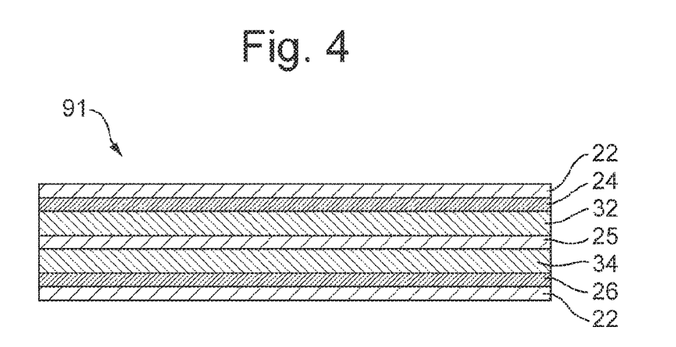
FIG. 4 depicts, in cross-section, an ultra short stroke actuator according to an embodiment of the invention.

FIG. 4 illustrates a typical piezoelectric stack 91 of the ultra short stroke actuator 9 in cross-section. The piezoelectric stack 91 comprises insulating material, electrodes and at least one layer of shear piezoelectric material for shear movement. A typical thickness is about 1 mm. In the embodiment of FIG. 4 outer layers 22 are inactive material (e.g. electrically insulating) with a thickness of typically 0.1 mm. Three electrode layers 24, 25, 26 are provided. The top two electrodes 24, 25 are used to apply a potential difference across piezoelectric layer 32 which may be for movement in the x direction and is between the top two electrodes 24, 25. The bottom two electrodes 25, 26 are provided for applying a potential difference across the second piezoelectric layer 34 arranged for shear movement in the y direction and is between the bottom two electrodes 25, 26. The electrode layers 24, 25, 26 typically have a thickness of 0.1 mm and each piezoelectric shear layer typically has a thickness of 0.25 mm.

The benefit of positioning the ultra short stroke actuator 9 between the patterning device holder 4 and short stroke actuator 8 is that the kinematic positioning by z supports (not illustrated) of the patterning device support 1 can be implemented as usual and the high x y stiffness remains unaltered.

Figure 5:
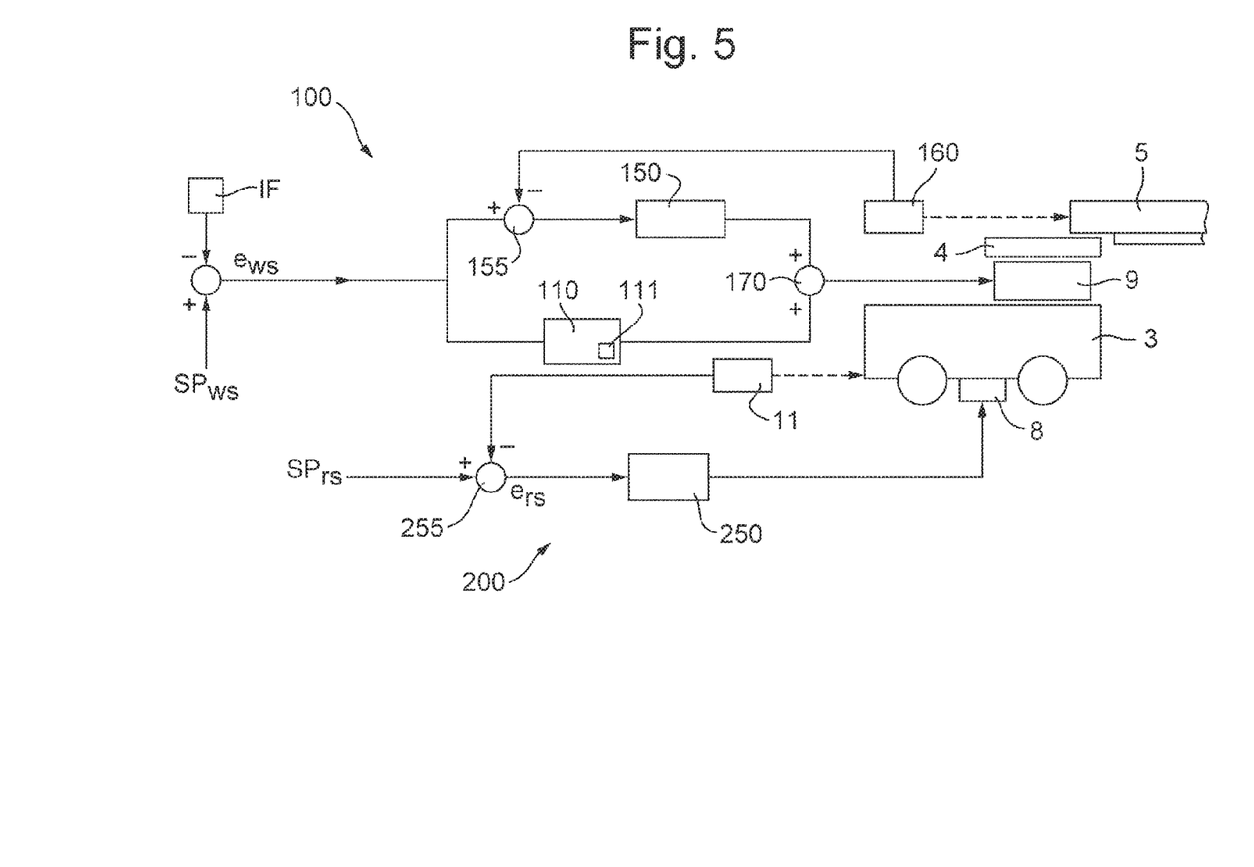
FIG. 5 illustrates a control scheme for a patterning device support according to an embodiment of the invention.

FIG. 5 shows a control scheme for the patterning device support 1. The control scheme is implemented under control of a single or multiple controllers each of which may or may not be part of the control system 500.

In the embodiment of FIG. 5 an ultra short stroke actuator controller 100 is present as well as a short stroke actuator controller 200. As an input signal a set point $SP_{rs}$ for the desired position of the short stroke part 3 is provided. The desired position $SP_{rs}$ of the short stroke part 3 can be determined by the control system 500, for example. A simple control loop using the position measurement system 11 to determine the actual position of the short stroke part 3 is used. The signal from the position measurement system 11 is subtracted from the desired position $SP_{rs}$ at comparator 255 of the short stroke actuator controller 200. The output of comparator 255 is therefore an error signal $e_{rs}$ relating to the positional error of the short stroke part 3 which is a difference between a desired position of the short stroke part 3 relative to the reference object 6 and the actual position of the short stroke part relative to the reference object 6. This signal is denoted $e_{rs}$ and is provided to a short stroke controller 250. On the basis of this signal the short stroke controller 250 provides a control signal to the short stroke actuator 8 to move the short stroke part 3 closer the desired position.

The error in position of the substrate stage can be determined by subtracting the actual position of the substrate stage (for example, as measured by the position sensor IF described above with reference to FIG. 1) and a set point for the substrate stage (set, for example, by the control system 500). The error in position of the substrate is a substrate positional error $e_{ws}$ which is a difference between a desired position of the substrate/substrate stage relative to a reference object and an actual position of the substrate/substrate stage relative to a reference object. Because the position of the substrate on the substrate table is known, the positional error of the substrate table $e_{ws}$ can be assumed to be the positional error of the substrate W. In an embodiment the error signal $e_{ws}$ in FIG. 5 may be instead a positional error of the substrate itself rather than of the substrate stage, although the two signals are actually indicative of the same error.

In the embodiment of FIG. 5 the ultra short stroke actuator controller 100 is comprised of two control parts. This includes an open loop control part 110 and a closed loop control part 150. The open and closed loop control parts 110, 150 and the short stroke controller 250 may each be part of the control system 500 or may be separate control parts which together form a controller. The closed loop control part 150 incorporates a comparator 155 and requires positional measurement of the patterning device 5 or patterning device holder 4 using positional measurement device 160. In an embodiment only the open loop control 110 is used. In an embodiment only the closed loop controller 150 and associated comparator and positional measurement device 160 are used. The positional measurement device 160 measures the position of the patterning device 5 or patterning device holder 4 relative to the short stroke part 3. Thus, the positional measurement device 160 measures the effect of movement of the actuator 9. Alternatively, the position measurement system 160 measures the position of the patterning device 5 or patterning device holder 4 with respect to an object 6 (e.g. the same reference as measurement system 11), and the relative position of the patterning device 5 or patterning device holder 4 with respect to the short stroke part 3 is deducted from both position measurements 11 and 160.

The open loop controller 110 works on the basis of a knowledge of the amount of deflection of the ultra short stroke actuator 9 for any given applied voltage, charge or current. A knowledge of the relationship between applied voltage, charge or current and displacement can be obtained using a calibration technique as described below with reference to FIG. 7 or this information can be provided, for example by the manufacturer of the ultra short stroke actuator 9. The knowledge or information may be stored on a memory of the open loop controller 110. In some instances the relationship between applied voltage, charge or current and displacement may not be well known. In that case the open loop controller 110 may comprise a multiplier 111. The multiplier 111 can set a multiplication factor of the position error signal $e_{ws}$. A multiplication factor of 1 is used, for example, where the relationship between applied voltage or current and displacement is very well known. A lower multiplication factor might be applied in an embodiment where the relationship between applied voltage and/or current and displacement is less well known. Typically the multiplier 111 sets a multiplication factor of the positional error signal $e_{ws}$ to be between 1 and 0.2.

The closed loop controller 150 works on the basis of feedback. The controller 150 applies a control signal to the ultra short stroke actuator 9. The positional measurement device 160 records the change in position of the patterning device 5 and/or patterning device holder 4 relative to the short stroke part 3. The positional measurement device 160 provides the signal to comparator 155. The comparator 155 subtracts the signal from the positional measurement device 160 from the positional error signal $e_{ws}$. In this way the closed loop controller 150 adjusts the position of the patterning device holder 4 based on a feedback loop.

In the embodiment of FIG. 5 where both the closed loop controller 150 and open loop controller 110 are implemented, the signals from the two controllers are added by adder 170 and provided to the ultra short stroke actuator 9.

In the embodiment of FIG. 5 the ultra short stroke actuator controller 100 therefore controls the ultra short stroke actuator 9 exclusively on the basis of the substrate positional error $e_{ws}$ and optionally on the measured position of the patterning device holder relative to the moveable structure.

If only the open loop controller 110 is used, the ultra short stroke actuator 9 is controlled only on the basis of the substrate positional error $e_{ws}$. In the situation that no closed loop controller 150 is used, no active damping of the resonance due to the patterning device 5 on the stiffness of the patterning device holder 4 occurs. In such a situation, it may be beneficially to damp the resonance by additional damping means. In a first embodiment, this is realized by creating an electrical resonance at the same frequency of the mechanical resonance and consequently to dissipate electrical energy into a resistance. In a preferred embodiment, a passive RL damping network is combined with the charge amplifier that is used to drive the piezo actuator. In a second embodiment, internal force feedback in the ultra short stroke actuator 9 may be used. This requires an additional piezoelectric stack 91 acting as a sensor and providing position feedback to the actuating piezo. Such a piezoelectric stack may be realized by combining two of the piezoelectric stacks 91 as explained with reference to FIG. 4. The combination of an actuator piezo and a sensor piezo placed between the patterning device holder 4 and the patterning device 5 forms together a local closed-loop control system providing active damping. Such additional damping embodiments are beneficial as the required space near the patterning device 4/patterning device holder 5 may be limited in practical situations. In a third embodiment the piezoelectric stack 91 is simultaneously used as piezo actuator and as piezo sensor. This can be realized by superposing a high frequent detection voltage on top of the applied (driving) voltage, wherein the frequency of the detection voltage exceeds the so-called Nyquist frequency. Based on the detection voltage a capacity change can be measured (e.g. by using a LCR-bridge) and consequently the position (elongation or compression) of the piezoelectric stack can be derived. If alternatively or additionally the closed loop controller 150 is used, the ultra short stroke actuator 9 is moved only on the basis of the substrate positional error $e_{ws}$ and the measured position of the patterning device 5 and/or patterning device holder 4 relative to the short stroke part 3. The latter signal is used in a feedback manner.

Figure 6:
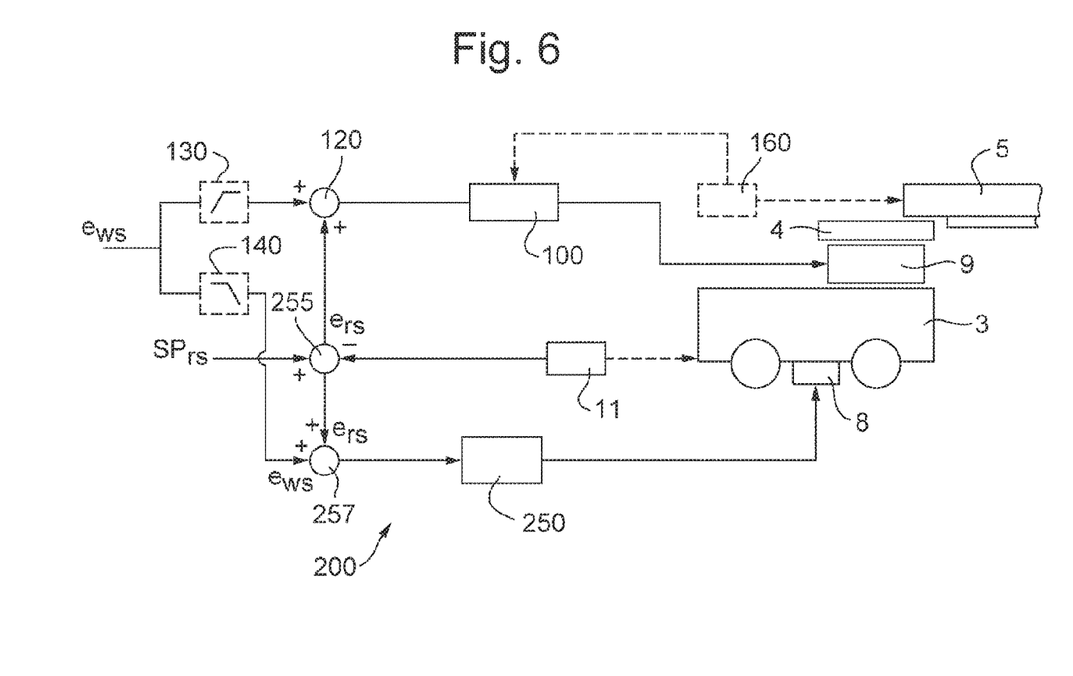
FIG. 6 illustrates a control scheme for a patterning device support according to an embodiment of the invention.

In an embodiment the ultra short stroke actuator controller 100 uses one or both of the open loop controller 110 and closed loop controller 150 and moves the ultra short stroke actuator 9 on the basis of a positional error other than the positional error of the substrate stage. The positional error might be an error in position of the short stroke part 3, for example. In the embodiment of FIG. 6 the ultra short stroke actuator controller 100 has as its input both the error $e_{ws}$ of the substrate stage and the error $e_{rs}$ of the short stroke part.

The embodiment of FIG. 6 is the same as that of FIG. 5 except as described below. In the embodiment of FIG. 6 both the short stroke actuator controller 200 and ultra short stroke actuator 100 drive their respective actuators at least partly on both the substrate positional error $e_{ws}$ and the short stroke part error $e_{rs}$. The substrate stage error $e_{ws}$ and short stroke part error $e_{rs}$ are calculated in the same way as described with reference to FIG. 5. The two signals are added together by adders 120, 257 and are provided to corresponding controllers 100, 250. The ultra short stroke actuator controller 100 may then operate in accordance with the embodiment described with reference to FIG. 5 with one or both of the open loop controller 110 and closed loop controller 150 and positional measurement signal from positional measurement device 160.

The dynamic response of the ultra short stroke actuator 9 is better than that of the short stroke actuator 8. However, a disadvantage of the ultra short stroke actuator 9 is that for a large working range (for example +/−200 nm) hysteresis, non-linearity and drift can be a difficulty. Piezo non-linearility is a non linear relationship between applied voltage, charge or current and displacement and as a result non-linearity can result in extra difficulty in control of a piezo actuator. The embodiment of FIG. 6 addresses these issues by correcting for the substrate stage positional error $e_{ws}$ using both the ultra short stroke actuator 9 and the short stroke actuator 8. This has the benefit of reducing the required working range of the ultra short stroke actuator 9 to about +/−50 nm which reduces piezo non-linearity, hysteresis and drift.

In an embodiment a high band pass filter 130 and low band pass filter 140 are provided. These are arranged such that substrate positional error $e_{ws}$ (and/or short stroke part 3 errors $e_{rs}$) are filtered so that error components with a high frequency (e.g. above a predetermined magnitude) are dealt with by the ultra short stroke actuator 9 whereas error components with a low frequency (e.g. below the predetermined magnitude) are dealt with by the short stroke actuator 8. This is beneficial as it takes advantage of strengths of each type of actuator.

The below table shows modeling results for the embodiment of FIG. 6 illustrating in three columns the position error of the substrate WS-x, the results using only the short stroke actuator 8 to control for substrate stage positional errors WR, original and in the right hand most column the results for the FIG. 6 embodiment WR, piezo addition. The model assumes that there is no error in the position of the short stroke part 3 (i.e. $e_{rs}$ equals zero). The first row indicates the maximum moving average error in the image position, the second row the maximum moving standard deviation of the image position error and the next two rows give the three sigma values of those two errors. As can be seen, a significant improvement is obtained using the ultra short stroke actuator 9 in addition to the short stroke actuator 8 to correct for errors in substrate stage position.

| [nm] | WS-x | WR, original | WR, Piezo addition |
| --- | --- | --- | --- |
| MA max | 3.73 | 0.95 | 0.05 |
| MSD max | 5.75 | 4.55 | 3.01 |
| MA m + 3s | 2.25 | 0.58 | 0.03 |
| MSD m + 3s | 4.33 | 4.49 | 3.27 |

Both the closed loop controller 150 and open loop controller 110 require some information regarding the relationship between displacement and applied voltage or current for the ultra short stroke actuator 9. In an embodiment the controller 100 applies a known voltage, charge and/or current to the actuator 9. A signal from the positional measurement device 160 is monitored to sense the amount of movement of the patterning device 5 and/or patterning device holder 4. This information can be stored in a memory 180 of the controller 100 and be used by the open loop controller 110 and/or closed loop controller 150.

Figure 7:
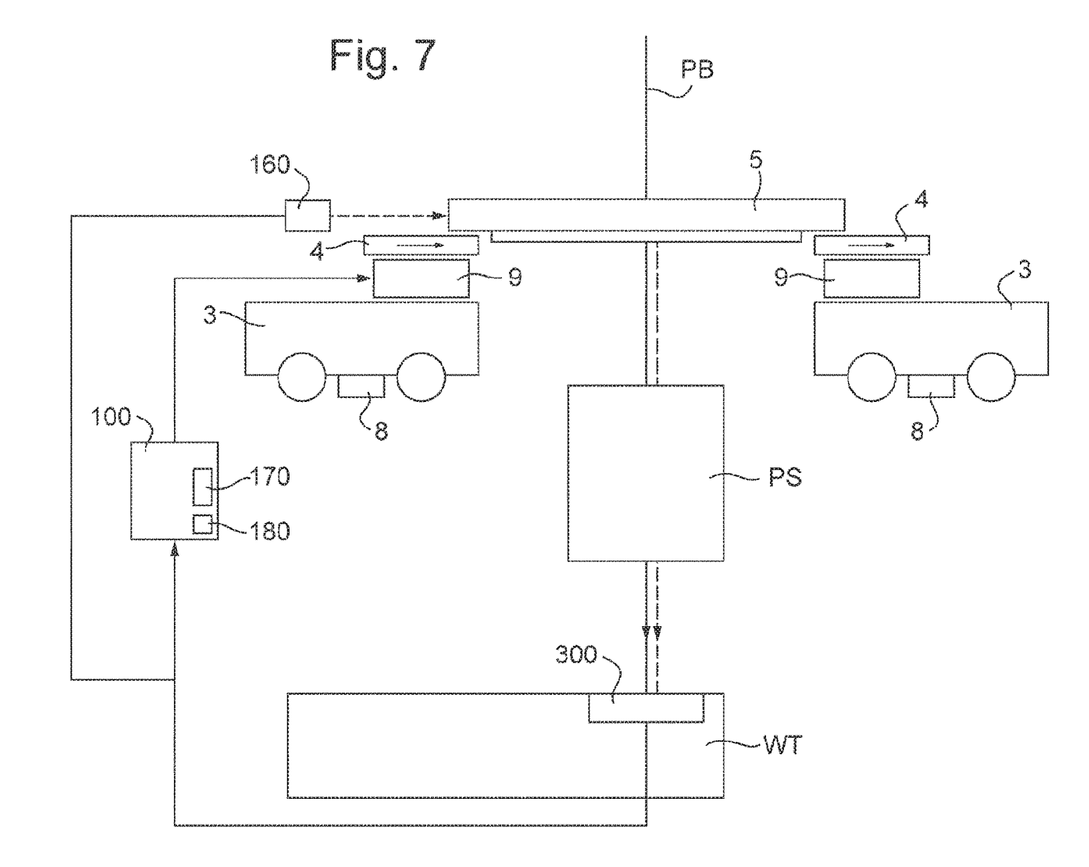
FIG. 7 illustrates a method of calibrating an ultra short stroke actuator controller according to an embodiment of the invention.

FIG. 7 illustrates schematically a different way in which the ultra short stroke actuator 100 can comprise a calibrator 170 which can establish a relationship between applied voltage, charge and/or current and displacement of the ultra short stroke actuator 9. In an embodiment the controller 100 alternatively or additionally uses a signal from a transmission image sensor (TIS) 300 rather than from the positional measurement device 160. The transmission image sensor 300 may be provided on the substrate table WT, for example. The transmission image sensor 300 can be used to determine the change in position of the patterned beam of radiation down stream of the projection system (e.g. at the level of the substrate) following application or a change of an applied voltage, charge and/or current to the ultra short stroke actuator 9. This information may be particularly useful in that it provides a direct link between the voltage, charge or current applied to the ultra short stroke actuator 9 by the controller 100 on the change in position of the patterned image at the substrate level. Therefore, a signal relating the error in position of the substrate can be compared directly to the values obtained during calibration of the amount of movement of the patterned image and a corresponding voltage applied to the ultra short stroke actuator 9 to correct for the error in position.

Figure 8:
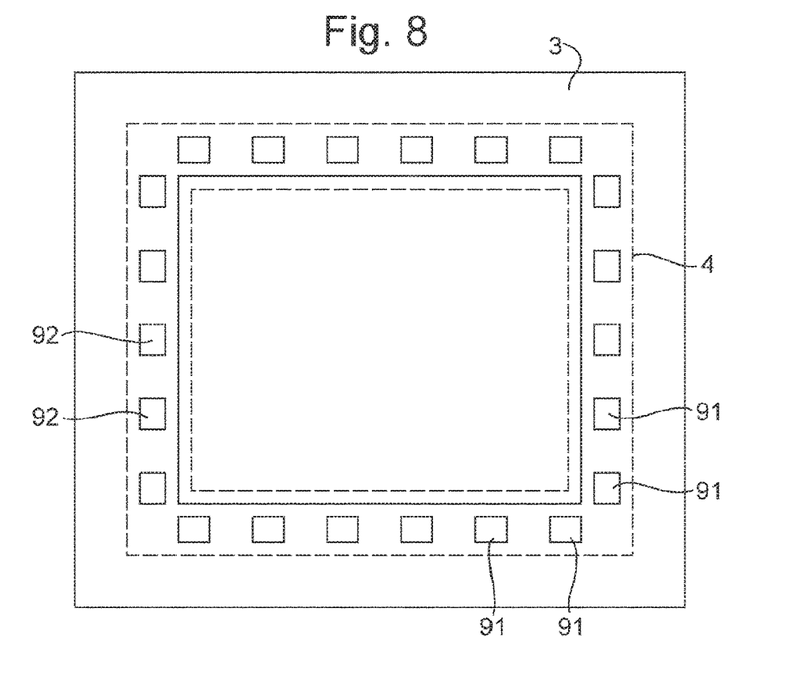
FIG. 8 illustrates, in plan, a plurality of ultra short stroke actuators according to an embodiment of the invention.
Figure 9:
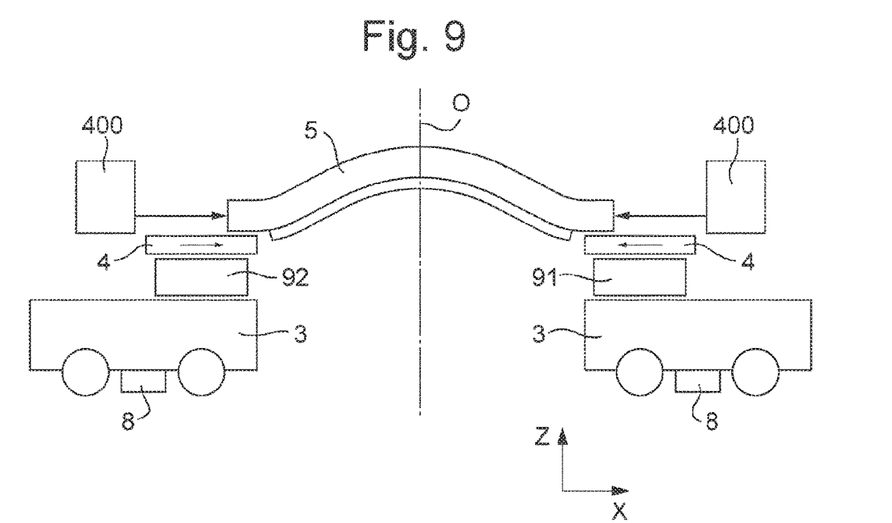
FIG. 9 illustrates, in cross-section, use of the plurality of ultra short stroke actuators of FIG. 8 during patterning device bending according to an embodiment of the invention.

In US 2011/0222039, hereby incorporated in its entirety by reference, the idea of patterning device 5 bending is disclosed. In the embodiment of FIGS. 8 and 9 the ultra short stroke actuator 9 can be used in such a system. In an embodiment the ultra short stroke actuator 9 is used to apply a force to the patterning device 5 in order to bend it. In an embodiment the ultra short stroke actuator 9 is used to reduce a force between the patterning device holder 4 and the patterning device 5 after a patterning device actuator 400 has been used to apply a torque or a force to the patterning device 5 in order to bend it (as illustrated in FIG. 9 and described in US 2011/0222039).

As is illustrated in plan in FIG. 8, the ultra short stroke actuator 9 may in fact be comprised of a plurality of piezoelectric stacks 91, 92. In an embodiment the individual piezoelectric stacks 91, 92 are provided around a circumference of the object holder 4. For example, the piezoelectric stacks 91, 92 may be provided equally spaced around the circumference. Each of the piezoelectric stacks 91, 92 may be individually controlled by the ultra short stroke actuator controller 100. Therefore, in order to apply a force to the patterning device 5 or to reduce a force between the patterning device 5 and the patterning device holder 4 when a force is applied by a patterning device actuator 400 to the patterning device 5, the ultra short stroke actuator stacks 91, 92 may be used to impart a non constant force around the circumference of the moveable member 4. In the example of FIG. 9, the patterning device holder 4 is made to move radially inward by the plurality of piezoelectric stacks 91, 92 in the x-direction so as to reduce a force between the patterning device 5 and the patterning device holder 4. This reduces the likelihood of slippage between the patterning device holder 4 and patterning device 5; when the patterning device 5 is bent in the x-direction the distance in the x-direction between ends of the patterning device 5 becomes less. Without a corresponding reduction in the distance between parts of the patterning device holder 4 to which the patterning device 5 is attached, deleterious slippage between the patterning device 5 and patterning device holder 4 may occur.

In an additional or alternative embodiment, heat loads applied to the patterning device 5 which can result in thermal expansion/contraction of the patterning device and therefore the generation of forces between the patterning device 5 and the patterning device holder 4 are compensated. These forces are reduced by the piezoelectric stacks 91, 92 as discussed above. The control may require an estimate of the amount of thermal expansion/contraction, for example based on a measured temperature distribution or measured stress/strain.

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to the interferometer system described herein for the tables. The encoder system comprises a sensor, transducer or read head associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or read heads. The one or more of sensors, transducers or read heads cooperate with the scale(s) or grid(s) to determine the position, velocity. etc. of the component. In an embodiment, a frame of the lithographic apparatus with respect to which a component moves has one or more scales or grids and the movable component (e.g., the substrate table and/or the measurement and/or cleaning table) has one or more of sensors, transducers or read heads that cooperate with the scale(s) or grid(s) to determine the position, velocity, etc. of the component.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithographic apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a patterning device support constructed to support a patterning device, the patterning device being capable of imparting a radiation beam with a pattern in its cross-section to form a patterned radiation beam, the patterning device system comprising a moveable structure movably arranged with respect to an object, a patterning device holder movably arranged with respect to the movable structure and configured to hold the patterning device, an actuator configured to move the movable structure with respect to the object, and an ultra short stroke actuator configured to move the patterning device holder with respect to the movable structure;
   a substrate support constructed to hold a substrate;
   a projection system configured to project the patterned radiation beam onto a target portion of the substrate,
   a transmission image sensor for measuring a position of the patterned radiation beam downstream of the projection system; and
   a calibrator for determining a relationship between magnitude of an applied control signal to the ultra short stroke actuator and resulting change in position of the patterned radiation beam and/or patterning device holder and/or patterning device.

2. The lithographic apparatus of claim 1, wherein the transmission image sensor is mounted on the substrate support.

3. The lithographic apparatus of claim 1, further comprising a controller configured to move the ultra short stroke actuator at least partly in a feed forward manner based on the determined relationship.

* * * * *

UNITED STATES PATENT AND TRADEMARK OFFICE
CERTIFICATE OF CORRECTION

PATENT NO. : 10,234,774 B2
APPLICATION NO. : 15/949057
DATED : March 19, 2019
INVENTOR(S) : Butler Page 1 of 1

It is certified that error appears in the above-identified patent and that said Letters Patent is hereby corrected as shown below:

On the Title Page

Page 2, Item (56), delete "2010/0013054" insert --2010/0013354 01/2010 Marth et al.--

Signed and Sealed this
Twelfth Day of November, 2019

Andrei Iancu
*Director of the United States Patent and Trademark Office*